United States Patent
Cheng et al.

(10) Patent No.: US 9,287,115 B2
(45) Date of Patent: Mar. 15, 2016

(54) PLANAR III-V FIELD EFFECT TRANSISTOR (FET) ON DIELECTRIC LAYER

(71) Applicant: INTERNATIONAL BUSINESS MACHINES CORPORATION, Armonk, NY (US)

(72) Inventors: Cheng-Wei Cheng, White Plains, NY (US); Edward W. Kiewra, South Burlington, VT (US); Amlan Majumdar, White Plains, NY (US); Uzma Rana, Chappaqua, NY (US); Devendra K. Sadana, Pleasantville, NY (US); Kuen-Ting Shiu, Yorktown Heights, NY (US); Yanning Sun, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 69 days.

(21) Appl. No.: 14/206,220

(22) Filed: Mar. 12, 2014

(65) Prior Publication Data
US 2015/0262818 A1    Sep. 17, 2015

(51) Int. Cl.
*H01L 21/02*         (2006.01)
(52) U.S. Cl.
CPC ...... *H01L 21/02488* (2013.01); *H01L 21/0262* (2013.01); *H01L 21/02494* (2013.01); *H01L 21/02538* (2013.01); *H01L 21/02639* (2013.01)
(58) Field of Classification Search
CPC .................. H01L 21/02639; C30B 25/186
See application file for complete search history.

(56) References Cited

U.S. PATENT DOCUMENTS

| | | | |
|---|---|---|---|
| 7,435,639 B2 | 10/2008 | Winstead et al. | |
| 7,834,456 B2 | 11/2010 | Tabatabaie et al. | |
| 7,968,438 B2 | 6/2011 | Han et al. | |
| 8,212,294 B2 | 7/2012 | Hoke et al. | |
| 8,283,239 B2 | 10/2012 | Beaumont et al. | |
| 8,329,565 B2 | 12/2012 | Arena et al. | |
| 8,377,796 B2 | 2/2013 | Yu et al. | |
| 8,384,196 B2 | 2/2013 | Cheng et al. | |
| 8,430,056 B2 | 4/2013 | Pan | |
| 8,481,341 B2 | 7/2013 | Clark | |
| 2007/0267722 A1* | 11/2007 | Lochtefeld et al. | 257/618 |
| 2010/0025683 A1 | 2/2010 | Cheng | |
| 2013/0034943 A1 | 2/2013 | Lochtefeld | |
| 2013/0233238 A1* | 9/2013 | Vincent et al. | 117/58 |
| 2014/0329376 A1* | 11/2014 | Sanchez et al. | 438/492 |

OTHER PUBLICATIONS

Yokoyama, M., et al. "Extremely-Thin-Body Ingaas-On-Insulator Mosfets on Si Fabricated by Direct Wafer Bonding", Electron Devices Meeting (IEDM), 2010 IEEE International, Dec. 2010. 4 Pages, Dated Dec. 2010.

(Continued)

*Primary Examiner* — Thomas L Dickey
(74) *Attorney, Agent, or Firm* — Tutunjian & Bitetto, P.C.; Louis J. Percello (57) ABSTRACT

A method of forming a semiconductor substrate including a type III-V semiconductor material directly on a dielectric material that includes forming a trench in a dielectric layer, and forming a via within the trench extending from a base of the trench to an exposed upper surface of an underlying semiconductor including substrate. A III-V semiconductor material is formed extending from the exposed upper surface of the semiconductor substrate filling at least a portion of the trench.

20 Claims, 5 Drawing Sheets

(56) References Cited

OTHER PUBLICATIONS

Wu, Y.Q., et al., "Atomic-Layer-Deposited Al2O3/Gaas Metal-Oxide-Semiconductor Field-Effect Transistor on Si Substrate Using Aspect Ratio Trapping Technique" Applied Physics Letters. vol. 93, Issue 24. Dec. 2008. 5 Pages, Dated Dec. 2008.

* cited by examiner

PLANAR III-V FIELD EFFECT TRANSISTOR (FET) ON DIELECTRIC LAYER

BACKGROUND

1. Technical Field

The present disclosure relates to semiconductor devices, and more particularly to semiconductor devices composed of III-V semiconductor materials.

2. Description of the Related Art

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have become critical.

SUMMARY

In one embodiment, a method of forming a semiconductor device is provided that includes forming a trench in a dielectric layer, wherein the dielectric layer is present on a semiconductor including substrate. A via is formed within the trench extending from a base of the trench to an exposed upper surface of the semiconductor including substrate. A III-V semiconductor material is epitaxially formed extending from the exposed upper surface of the semiconductor including substrate filling at least a portion of the trench. A semiconductor device is formed on the III-V semiconductor material that is present in the trench.

In another embodiment, a method of forming a semiconductor substrate is provided that includes forming a trench in a dielectric layer, the dielectric layer being present on a semiconductor including substrate. A via is formed within the trench, wherein the via extends from a base of the trench to an exposed upper surface of the semiconductor including substrate. A III-V semiconductor material is epitaxially formed extending from the exposed upper surface of the semiconductor including substrate filling at least a portion of the trench.

In another aspect of the present disclosure, an electrical device is provided on a substrate comprised of a III-V semiconductor material that is directly on a dielectric layer. In one embodiment, the electrical device comprises a base semiconductor layer of a silicon including material and a dielectric layer present on the base semiconductor layer. A III-V semiconductor material is present in a trench in the dielectric layer. The III-V semiconductor material is present in direct contact with at least the dielectric layer at a base of the trench. A via of the III-V semiconductor material extends from the trench through the dielectric layer into contact with the base semiconductor layer. A semiconductor device is present on the III-V semiconductor material.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein are related to forming semiconductor devices on type III-V semiconductor materials. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. For example, when the dominant carrier concentration is electrons, the semiconductor device is referred to as being an n-type semiconductor device; and when the dominant carrier concentration is holes, the semiconductor device is referred to as being a p-type semiconductor device.

In one embodiment, the semiconductor devices suitable for use with methods and structures disclosed herein are field effect transistors (FETs). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on.

It is noted that the semiconductor devices for use with the methods and structures disclosed herein are not limited to only field effect transistors. Any planar semiconductor device is suitable for use with the methods and structures that are disclosed herein. The term "planar" as used to describe a semiconductor device orientation denotes that the direction of charge carriers from the source region to the drain region of the semiconductor device is along a plane that is parallel to the upper surface of the substrate, wherein a gate structure is present on the upper surface of the substrate. For example, the planar semiconductor device that is suitable for use with the present application includes junction field effect transistors (JFET), Schottky barrier devices, bipolar junction transistors having the appropriate planar orientation, flash memory devices, high-electron-mobility-transistor (HEMT), and combinations thereof.

A type "III-V" semiconductor material denotes a semiconductor material that includes at least one element from Group IIIA (group 13 under the modern International Union of Pure and Applied Chemistry (IUPAC)) and at least one element from Group VA (group 15 under the modern International Union of Pure and Applied Chemistry (IUPAC)) of the Periodic Table of Elements. Typically, the III-V compound semiconductors are binary, ternary or quaternary alloys including III/V elements.

It has been determined that forming planar semiconductor devices on type III-V semiconductor materials sitting on top of the low-k dielectrics reduces short channel effects. The short channel effect is the decrease of threshold voltage as the channel length is reduced. The low-k layer right below the MOSFET can impede the crosstalk of electric field between the source region and the drain region, and therefore mitigate short channel effect. Low defect density and single crystalline III-V semiconductor materials can not be directly formed on dielectric materials. Further direct wafer bonding techniques are complicated, and are expensive for mass production of complementary metal oxide semiconductor (CMOS) devices.

In some embodiments, the methods and structures disclosed herein may overcome at least some of the aforementioned disadvantages by epitaxially growing III-V semiconductor materials from a seed surface, i.e., semiconductor containing surface, to extend onto low-k dielectric materials. More specifically, in some embodiments, a method of forming a semiconductor substrate is provided that includes forming a trench in a dielectric layer that is present on a semiconductor including substrate; forming a via within the trench extending to an exposed upper surface of the semiconductor including substrate; and epitaxially forming a III-V semiconductor material extending from the exposed upper surface of the semiconductor including substrate, wherein the III-V semiconductor material fills at least a portion of the trench. In this embodiment, the exposed upper surface of the semiconductor substrate provides a seed layer for epitaxial growth of the III-V semiconductor material. The details of the above described method, and related structures, are now discussed in greater detail with reference to FIGS. 1-11.

Figure 1:
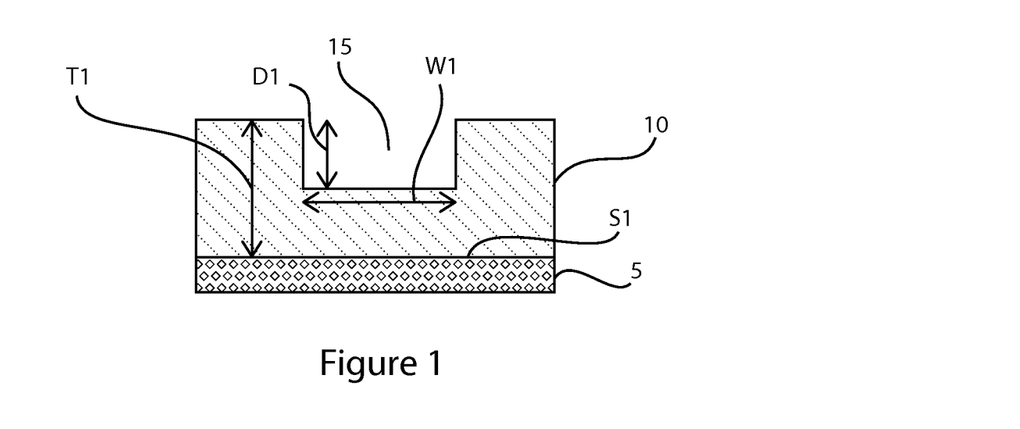
FIG. 1 is a side cross-sectional view depicting one embodiment of forming a trench in a dielectric material, wherein the dielectric material is present on a semiconductor including substrate, in accordance with the present disclosure.

FIG. 1 depicts one embodiment of forming a trench 15 in a dielectric layer 10 that is present on a semiconductor including substrate 5. In one embodiment, the semiconductor including substrate 5 is a bulk semiconductor substrate. A "bulk semiconductor substrate" is a substrate that is composed of a single semiconductor material. The semiconductor material that provides the bulk semiconductor substrate may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. In other embodiments, the semiconductor including substrate 5 may be a semiconductor on insulator (SOI) substrate. An SOI substrate includes a first semiconductor layer (also referred to as SOI layer) on a buried dielectric layer, wherein the buried dielectric layer is present on a second semiconductor layer (also referred to as base semiconductor layer).

In some embodiments, the upper surface S1 of the semiconductor including substrate 5 is a crystalline material, such as a single crystal material. The term "crystalline" includes nanocrystalline, polycrystalline or microcrystalline. The term "single crystalline" denotes a crystalline solid, in which the crystal lattice of the entire sample is substantially continuous and substantially unbroken to the edges of the sample, with substantially no grain boundaries.

The dielectric layer 10 may be formed on the upper surface S1 of the semiconductor including substrate 5. The dielectric layer 10 may be composed of an oxide, nitride or oxynitride material layer. In one example, when the dielectric layer 10 is composed of an oxide, the dielectric layer 10 may be composed of silicon oxide ($SiO_2$). In some embodiments, the dielectric layer 10 may be composed of a low-k dielectric material. As used herein, the term "low-k" denotes a dielectric constant of 4.0 or less measured from a dielectric at room temperature, e.g., 20° C. to 25° C., and at atmospheric pressure, e.g., 1 atm. In one embodiment, a dielectric layer 10 having a low-k dielectric has a dielectric constant ranging from 1.0 to 3.0. In one embodiment, a low-k dielectric layer 10 comprises SiCOH or an aromatic hydrocarbon polymer composition, such as SILK™. In another embodiment, the low-k dielectric layer 10 comprises carbon-doped oxides. In an even further embodiment, the low-k dielectric layer 10 comprises an undoped silica glass. In one embodiment, the low-k dielectric layer 10 is composed of diamond-like carbon (DLC). In one embodiment, the low-k dielectric layer is non-porous. In another embodiment, the low-k dielectric layer 10 is porous.

In one embodiment, the deposition process for forming the low-k dielectric layer 10 comprises chemical vapor deposition (CVD), plasma enhanced chemical vapor deposition (PECVD), physical vapor deposition (PVD), high-density plasma CVD or spin-on glass process. In one embodiment, the low-k dielectric layer has a thickness T1 ranging from 10 nm to 1000 nm. In another embodiment, the low-k dielectric layer 10 has a thickness T1 ranging from 100 nm to 500 nm.

FIG. 1 further depicts forming a trench 15 in the dielectric layer 10. The trench 15 may be formed deposition, photolithography and a selective etching process. Specifically, a first photoresist etch mask (not shown) is produced on the dielectric layer 10 by depositing a photoresist material layer onto the surface to be etched, exposing the photoresist material layer to a pattern of radiation, and then developing the patterned material into a first photoresist etch mask utilizing a resist developer. Once the patterning of the photoresist material is completed, the sections covered by the first photoresist etch mask are protected, while the exposed regions are removed using a selective etching process that removes the unprotected regions of the dielectric layer 10 to provide the trench 15. The etch process may be an anisotropic etch process, such as reactive ion etch (RIE). The etch process for forming the trench 15 recesses the dielectric layer 10, but does not remove the entirety of the dielectric layer 10 to expose the semiconductor including substrate 5. Following etching, the first photoresist etch mask may be removed using selective etching, chemical stripping or oxygen ashing.

The trench 15 may have a depth D1 ranging from 1 nm to 1000 nm. In another embodiment, the trench 15 has a depth D1 ranging from 5 nm to 30 nm. The trench 15 may have a width W1 ranging from 10 nm to 10000 nm. In another embodiment, the trench 15 has a width W1 ranging from 30 nm to 100 nm.

Figure 2A:
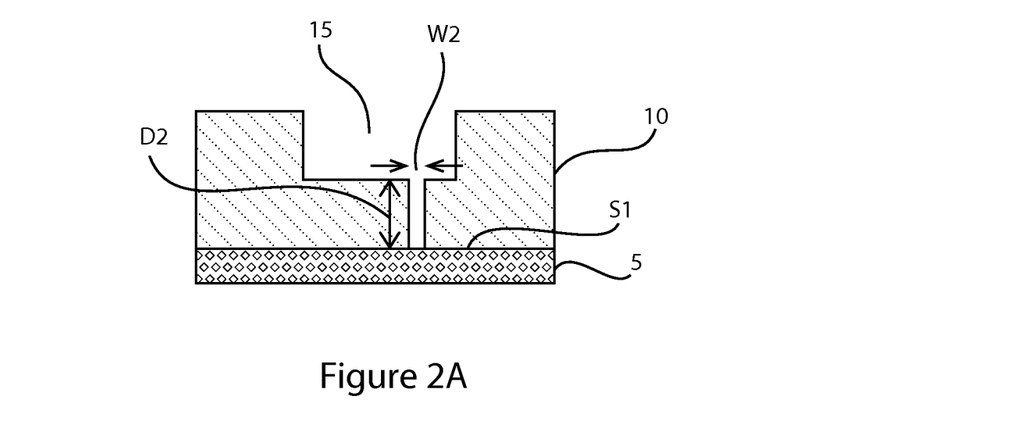
FIG. 2A is a side cross-sectional view depicting one embodiment of forming a via within the trench extending from a base of the trench to an exposed upper surface of the semiconductor including substrate, wherein the via is present underlying a drain region of the subsequently formed semiconductor device, in accordance with the present disclosure.
Figure 2B:
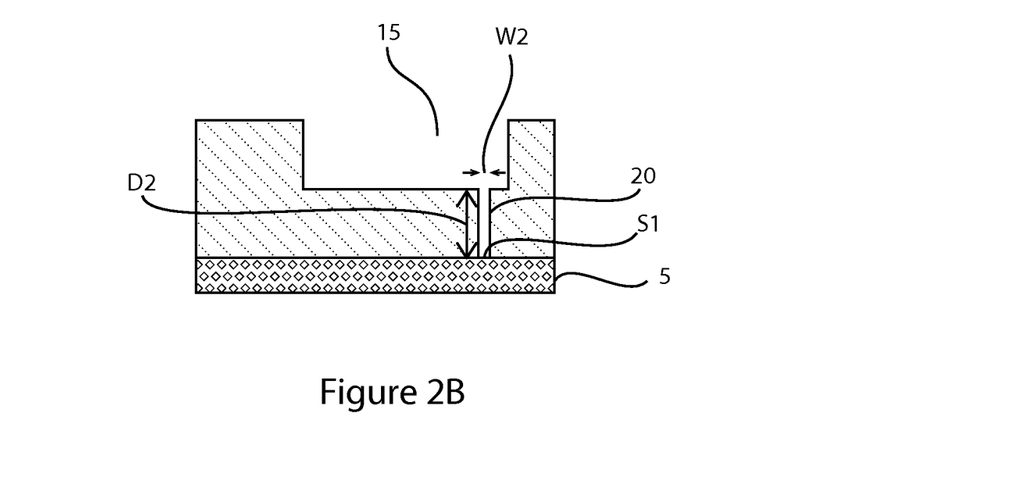
FIG. 2B is a side cross-sectional view depicting another embodiment of forming a via within the trench extending from a base of the trench to an exposed upper surface of the semiconductor including substrate, wherein the via is present to an exterior of a drain region of the subsequently formed semiconductor device, in accordance with the present disclosure.
Figure 2C:
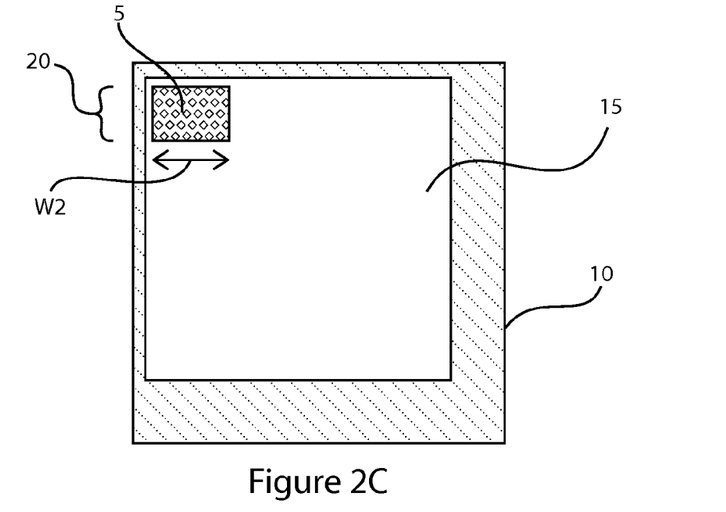
FIG. 2C is a side cross-sectional view depicting another embodiment of forming a via within the trench extending from a base of the trench to an exposed upper surface of the semiconductor including substrate, wherein the via is separated from the active region of the subsequently formed semiconductor device.

FIGS. 2A-2C depict some embodiments of forming a via 20 within the trench 15 extending from a base B1 of the trench 15 to an exposed upper surface S1 of the semiconductor including substrate 5. In some embodiments, the via 20 may be formed using photolithography and etch processes similar to the method of forming the trench 15 that is described above. For example, a second photoresist etch mask (not shown) is produced on the dielectric layer 10 and the trench 15 by depositing a photoresist material layer onto the surface to be etched, exposing the photoresist material layer to a pattern of radiation, and then developing the patterned material into a second photoresist etch mask utilizing a resist developer. Once the patterning of the photoresist material is completed, the sections of the trench 15 and dielectric layer 10 covered by the second photoresist etch mask are protected, while the exposed portion of the dielectric layer 10 that provides a portion of the base surface of the trench 15 is removed using a selective etch process.

The etch process for forming the via 20 may be a selective etch process that removes the unprotected regions of the dielectric layer 10 selectively to the second photoresist etch mask and the semiconductor including substrate 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1.

The etch process for forming the via 20 may be an etch process. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may also be timed and/or employ end point detection methods to determine when the etch process has reached and exposed a surface of the semiconductor including substrate 5. Following etching to form the via 20, the second photoresist etch mask may be removed using selective etching, chemical stripping or oxygen ashing.

The via 20 may have a depth D2 ranging from 1 nm to 500 nm. In another embodiment, the via 20 has a depth D2 ranging from 10 nm to 50 nm. The via 20 may have a width W2 ranging from 1 nm to 1000 nm. In another embodiment, the via 20 has a width W2 ranging from 5 nm to 50 nm.

FIG. 2A depicts one embodiment of the present disclosure in which the via 20 is present in the portion of the trench 15 that would position the via 20 underlying a drain region of a subsequently formed semiconductor device. It is noted that the via 20 may be positioned under any active region of the subsequently formed semiconductor device including the channel region and source region. FIG. 2B depicts another embodiment, in which the via 15 is positioned extending from a base of the trench 15 to an exposed upper surface S1 of the semiconductor including substrate 5, wherein the via 10 is present to an exterior of a drain region or source region of the subsequently formed semiconductor device. FIG. 2C depicts another embodiment of the present disclosure in which the via 20 is separated from the active region of the subsequently formed semiconductor device. FIG. 2C is a top down view depicting a via 20 having a multi-sided shape. It is noted that the via 20 is not limited to only this geometry. For example, the via 20 may have a circular or oblong shape when view from the top down perspective.

Figure 3:
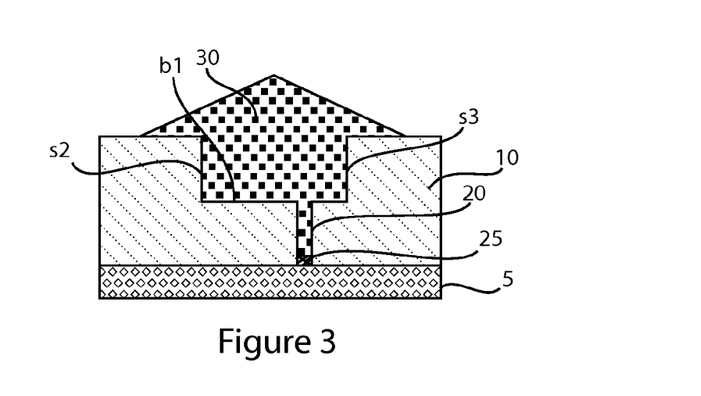
FIG. 3 is a side cross-sectional view depicting epitaxially forming a III-V semiconductor material extending from the exposed upper surface of the semiconductor including substrate filling at least a portion of the trench depicted in FIG. 2A, in accordance with one embodiment of the present disclosure.

FIG. 3 depicts one embodiment of epitaxially forming a type III-V semiconductor material 30 extending from the exposed upper surface S1 of the semiconductor including substrate 5 filling the via 20 and filling at least a portion of the trench 15. In one embodiment, the III-V semiconductor material 30 may be composed of at least one material selected from the group consisting of from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The terms "epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

In some embodiments, the exposed upper surface S1 of the semiconductor including substrate 5 provides the seed surface for epitaxial growth of the III-V semiconductor material 30. More specifically, epitaxially growth of the III-V semiconductor material 30 starts at the exposed upper surface S1 of the semiconductor including substrate 5 filling the via 20 as the deposition process continues, wherein once the via 20 is filled the epitaxially III-V semiconductor material 30 grows from the via 20 into the trench 15. As the epitaxially growth process continues, the III-V semiconductor material 30 may fill the trench 15, wherein epitaxial III-V semiconductor material 30 is in direct contact with the base surface B1 and the sidewall surfaces S2, S3 of the trench 15. In some embodiments, the epitaxial growth may continue after the trench 15 is entirely filled and until a portion of the epitaxial III-V semiconductor material 30 extends from the trench 15 onto the upper surface of the dielectric layer 10 at the exterior of the trench 15.

A number of different sources may be used for the deposition of epitaxial III-V semiconductor material 30. In some embodiments, the sources for epitaxial growth of type III-V semiconductor material 30 include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking. The deposition chamber for the epitaxial growth process may be provided by a chemical vapor deposition apparatus, such as a plasma enhanced chemical vapor deposition apparatus or a metal organic chemical vapor deposition apparatus.

The type III-V semiconductor material 30 that is epitaxially grown from the exposed upper surface S1 of the semiconductor including substrate 5 is typically a crystalline material, such as a single crystalline material. In some embodiments, the portion of the epitaxial III-V semiconductor material 30 that is present within the via 20 and in direct contact with the exposed surface S1 of the semiconductor including substrate 5 may have a concentration, i.e., surface density, of crystalline defects that is greater than $1 \times 10^9$ defects/$cm^2$, and may be referred to as a high defect concentration interface 25. The crystalline defects may be dislocation defects, point defects, stacking faults and combinations thereof. In one embodiment, the concentration, i.e., surface density, of crystalline defects that are present at the high defect concentration interface 25 may range from $1 \times 10^{10}$ defects/$cm^2$ to $1 \times 10^7$ defects/$cm^2$.

As the type III-V semiconductor material 30 grows from the seed surface, i.e., exposed upper surface S1 of the semiconductor including substrate 5, through the via 20 into the trench 15, the defect density is reduced. The concentration of defects in the type III-V semiconductor material 30 that is present in the trench 15 may equal to $1 \times 10^6$ defects/$cm^2$ or less, and may be referred to as having a low defect density. In one embodiment, the defect density within the type III-V semiconductor material 30 that is present in the trench 15 may range from $1 \times 10^3$ defects/$cm^2$ to $1 \times 10^7$ defects/$cm^2$. In another embodiment, the defect density within the type III-V semiconductor material 30 that is present in the trench 15 may range from $1 \times 10^5$ defects/$cm^2$ to $1 \times 10^7$ defects/$cm^2$. It is noted that the above description of defect densities is provided for illustrative purposes only, and is not intended to limit the present disclosure to only the disclosed ranges.

Figure 4:
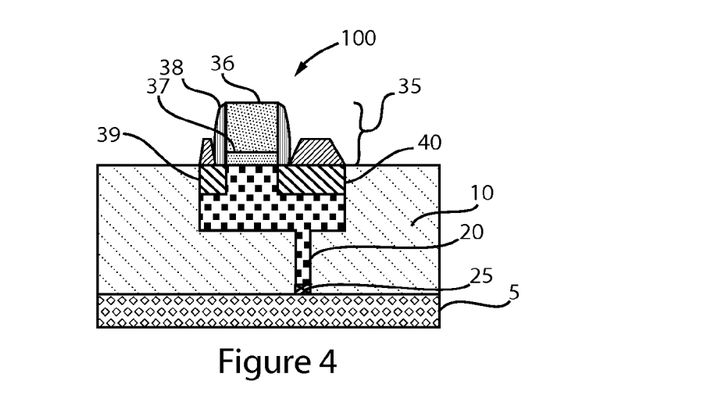
FIG. 4 is a side cross-sectional view depicting forming a semiconductor device on the III-V semiconductor material that is present in the trench of the dielectric material layer that is depicted in FIG. 3, in accordance with one embodiment of the present disclosure.

FIG. 4 depicts one embodiment of forming a semiconductor device 100 on the type III-V semiconductor material 30 that is present in the trench 15 within the dielectric material layer 10. In some embodiments, prior to forming the semiconductor device 100, the upper surface of the type III-V semiconductor material 30 may be planarized so that the upper surface of the type III-V semiconductor material 30 is coplanar with the upper surface of the dielectric layer 10. The upper surface may be planarized using a mechanical method such as chemical mechanical planarization (CMP) or grinding.

The semiconductor device 100 may be a field effect transistor including a gate structure 35 that is positioned on a channel region portion of the type III-V semiconductor material 30 with source and drain regions 39, 40 on opposing sides of the channel region portion. As used herein, the term "drain" means a doped region in semiconductor device located at the end of the channel region, in which carriers are flowing out of the device through the drain. The term "source" is a doped region in the semiconductor device, in which majority carriers are flowing into the channel region. The channel region is the region underlying the gate structure 35 and between the source and drain regions 39, 40 of a semiconductor device that becomes conductive when the semiconductor device is turned on. The term "gate structure" means a structure used to control output current (i.e., flow of carriers in the channel) of a semiconducting device through electrical or magnetic fields.

Each of the gate structures 35 for semiconductor devices of the field effect transistor type include at least one gate dielectric 37 that is present on the channel portion of the semiconductor device and at least one gate conductor 36 that is present on the at least one gate dielectric 37. The gate dielectrics 37 may be composed of a dielectric material, such as an oxide, nitride or oxynitride material. For example, the at least one gate dielectric 37 may be composed of silicon oxide. The gate dielectrics 37 may include high-k materials that may include may include, but are not limited to hafnium oxides, hafnium silicates, zirconium oxides, lanthanum oxides, titanium oxides, barium-strontium-titantates (BSTs) and lead-zirconate-titanates (PZTs). The gate conductor 36 may be composed of an electrically conductive material, such as a doped semiconductor or a metal. For example, the gate conductor 36 may be composed of n-type doped polysilicon. In other examples, the gate conductor may be composed of a metal having a work function suitable for enhancing the electrical properties of n-type or p-type semiconductor devices. The gate structures 35 may be formed using deposition, photolithography and etch processes. For example, a gate layer stack may be formed using by depositing at least one gate dielectric material layer on III-V semiconductor material 30, and then depositing at least one gate conductor material layer on the at least one gate dielectric material layer. The gate layer stack is then patterned and etched to provide the gate structure 35.

In some embodiments, a gate sidewall spacer 38 may be formed on the sidewall of the gate structure 35. The gate sidewall spacer 38 may be composed of a dielectric, such as an oxide, nitride or oxynitride material. The gate sidewall spacer 38 may be formed by deposition and etch back processes.

The source region 39 and drain region 40 may then be formed in the III-V semiconductor material 30. The source region 39 and the drain region 40 may be formed by doping portions of the type III-V semiconductor material 30 using ion implantation. The effect of the dopant atom in the type III-V semiconductor material 30, i.e., whether it is a p-type or n-type dopant, depends upon the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

In some embodiments, metal semiconductor alloy contacts 45 may be formed on the upper surface of the source region 30 and the drain region 40. In some embodiments, the formation of the metal semiconductor alloy contacts 45 typically requires depositing a refractory metal such as Ni or Ti onto the surface of a semiconductor containing material or wafer. Following deposition, the structure is then subjected to an annealing step using conventional processes such as, but not limited to, rapid thermal annealing. During thermal annealing, the deposited metal reacts with the semiconductor material forming a metal semiconductor.

Figure 5:
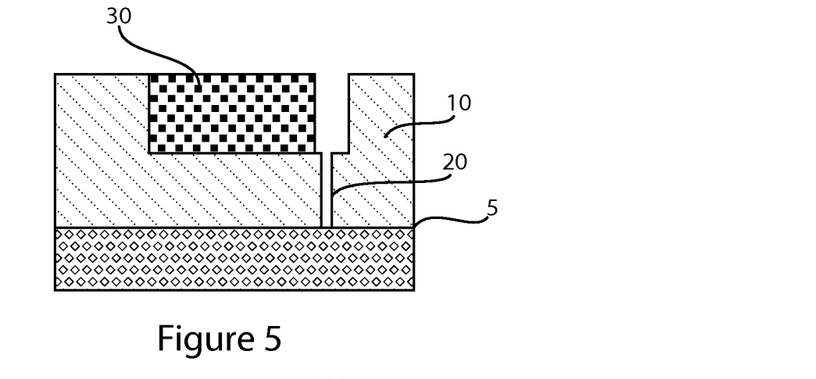
FIG. 5 is a side cross-sectional view depicting epitaxially forming a III-V semiconductor material in the trench depicted in FIG. 2B, wherein the portion of the III-V semiconductor material that is present in the via extending to the semiconductor including substrate is removed, in accordance with one embodiment of the present disclosure.

FIG. 5 depicts one embodiment of epitaxially forming a type III-V semiconductor material 30 in the trench 15 depicted in FIG. 2B, wherein the portion of the type III-V semiconductor material 30 that is present in the via 20 extending to the semiconductor including substrate 5 is removed. The type III-V semiconductor material 30 that is depicted in FIG. 5 is similar to the type III-V semiconductor material 30 that has been described above with reference to FIG. 3. Therefore, the description of the type III-V semiconductor material 30, and the method of forming the type III-V semiconductor material 30, that is provided above for FIG. 3 is suitable to describe the type III-V semiconductor material 30 that is depicted in FIG. 5.

The portion of the type III-V semiconductor material 30 that is present in the via 20 may be removed using etch processing. For example, an etch mask, such as a photoresist mask may be formed protecting the portion of the type III-V semiconductor material 30 within the trench 15 that is not present over the via 20. The etch mask used in the etch processes for removing the portion of the type III-V semiconductor material 30 that is within the via 20 is similar to the etch mask used to form the trench 15 in the dielectric layer 10 that is described above with reference to FIG. 1. The etch process for removing the portion of the III-V semiconductor material 30 that is present within the via 20 may be removed using a selective etch process. For example, the etch process may remove the unprotected portion (portion of III-V semiconductor material not covered by etch mask) of the III-V semiconductor material 30 with an etch chemistry that is selective to the etch mask, the dielectric layer 10 and the semiconductor including substrate 5. In some embodiments, the etch process may be an anisotropic etch, such as reactive ion etching or laser etching.

Figure 6:
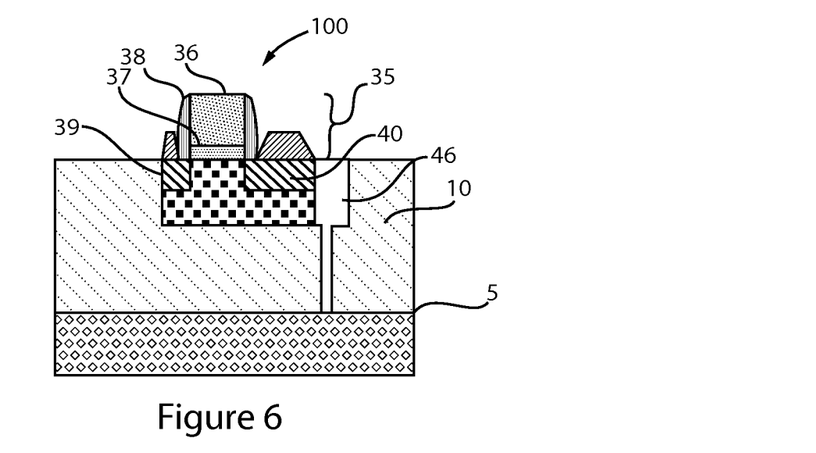
FIG. 6 is a side cross-sectional view depicting filling the via depicted in FIG. 5 with a dielectric, and forming a semiconductor device on the III-V semiconductor material.

FIG. 6 depicts one embodiment of filling the via 20 that is depicted in FIG. 5 with a dielectric fill 46, and forming a semiconductor device 100 on the III-V semiconductor material 30. The dielectric fill 36 may be selected from the group consisting of $SiO_2$, $Si_3N_4$, $SiO_xN_y$, SiC, SiCO, SiCOH, Hf-containing materials, $Al_2O_3$ and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC) (also known as amorphous hydrogenated carbon, α-C:H). Additional choices for the dielectric fill 46 include any of the aforementioned materials in porous form, or in a form that changes during processing to or from being porous and/or permeable to being non-porous and/or non-permeable. The dielectric fill 46 may be deposited using a chemical vapor deposition (CVD) process, such as atmospheric pressure CVD (APCVD), low pressure CVD (LPCVD), plasma enhanced CVD (PECVD), metal-organic CVD (MOCVD) and combinations thereof may also be employed. The dielectric 46 fill may also be formed using chemical solution deposition, spin on deposition, thermal growth and physical vapor deposition (PVD). Following deposition a planarization process, such as chemical mechanical planarization, may be applied so that an upper surface of the dielectric fill 46 is coplanar with an upper surface of the III-V semiconductor material 30.

The semiconductor device 100 that is depicted in FIG. 6 is similar to the semiconductor device 100 that is depicted in FIG. 4. Therefore, the description of the semiconductor device 100 depicted in FIG. 4 including the gate structure 35, the gate sidewall spacer 38, the source region 39, the drain region 40 and the metal semiconductor alloy contact 45 is suitable for the description of the semiconductor device 100 that is depicted in FIG. 6. Similar to the semiconductor device 100 that is depicted in FIG. 4, the semiconductor device 100 that is depicted in FIG. 6 includes a gate structure 35, gate sidewall spacer 38, source region 39, drain region 40 and metal semiconductor alloy contact 45.

Figure 7A:
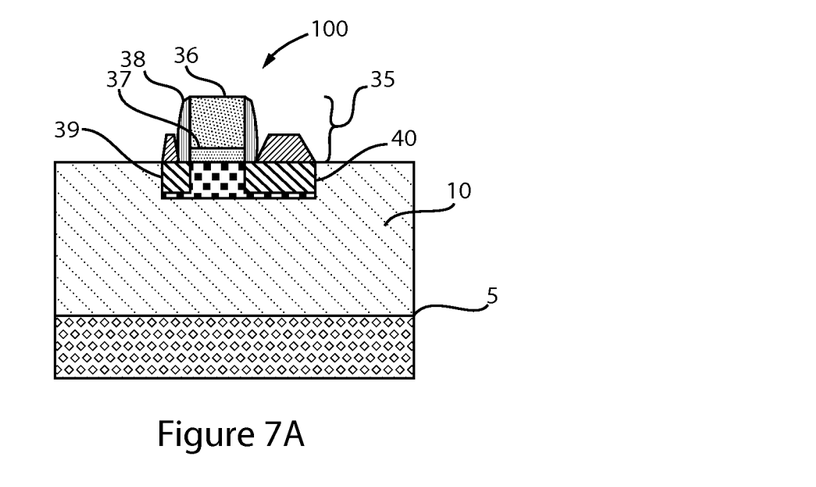
FIG. 7A is a side cross-sectional view depicting epitaxially forming a III-V semiconductor material in the trench depicted in FIG. 2C, removing the portion of the III-V semiconductor material that is present in the via extending to the semiconductor including substrate, forming a dielectric material filling the via and forming a semiconductor device on the III-V semiconductor material, in accordance with one embodiment of the present disclosure.
Figure 7B:
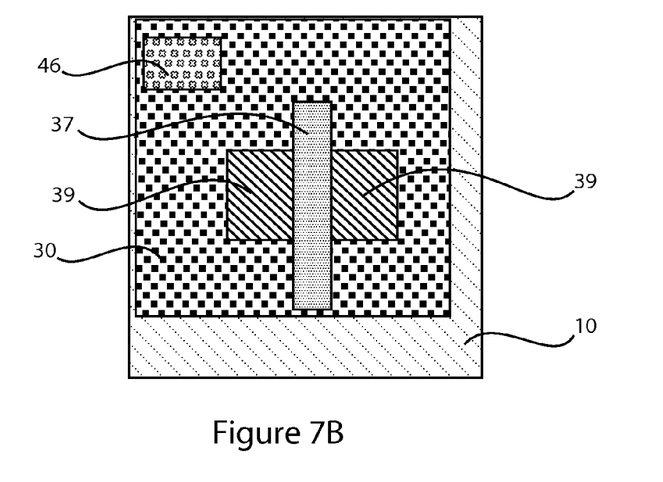
FIG. 7B is a top down view of the semiconductor device depicted in FIG. 7A.

FIGS. 7A and 7B depict epitaxially forming a III-V semiconductor material 30 in the trench 15 depicted in FIG. 2C, removing the portion of the III-V semiconductor material 30 that is present in the via 20 extending to the semiconductor including substrate 5, forming a dielectric fill 46 within the via 20 and forming a semiconductor device 100 on the III-V semiconductor material 30. FIG. 7B is a top down view of the semiconductor device depicted in FIG. 7A.

FIGS. 8-11 depict another embodiment of the present disclosure, in which a hybrid substrate is formed in which a first region of the substrate 500 includes an upper surface having a type IV semiconductor material and a second region of the substrate includes an upper surface having a type III-V semiconductor material. A type "IV" semiconductor material denotes a semiconductor material that includes at least one element from Group IVA (group 14 under the modern International Union of Pure and Applied Chemistry (IUPAC)) of the periodic table of elements.

Figure 8:
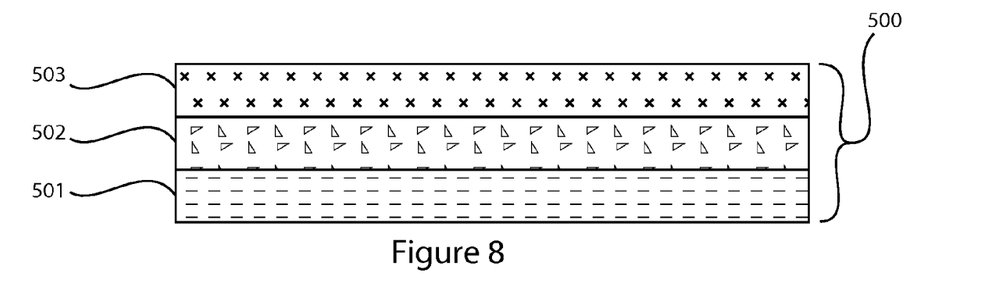
FIG. 8 is a side cross-sectional view of a semiconductor on insulator (SOI) substrate for use in one embodiment of the present disclosure.

FIG. 8 depicts one embodiment of a semiconductor on insulator (SOI) substrate 500 for use in one embodiment of the present disclosure. The semiconductor on insulator (SOI) substrate 500 may include at least a first semiconductor layer 503 (also referred to as a semiconductor on insulator (SOI) layer) overlying a dielectric layer 502, in which a base semiconductor layer 501 may be present underlying the dielectric layer 502. The semiconductor material that provides the semiconductor on insulator layer 503 may be any semiconducting material including, but not limited to Si, strained Si, SiC, SiGe, SiGeC, Si alloys, Ge, Ge alloys, GaAs, InAs, and InP, or any combination thereof. In one example, the semiconductor on insulator layer 503 is composed of silicon. The semiconductor on insulator layer 503 can have a thickness ranging from 5.0 nm to 15.0 nm. In another example, the semiconductor on insulator layer 503 has a thickness ranging from 7.5 nm to 12.5 nm. The base semiconductor layer 501 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 501 may have the same or a different composition than the semiconductor on insulator layer 503.

The dielectric layer 502 that may be present underlying the semiconductor on insulator layer 503 and atop the base semiconductor layer 501 may be formed by implanting a high-energy dopant into a bulk semiconductor substrate and then annealing the structure to form a buried insulating layer, i.e., dielectric layer 502. In another embodiment, the dielectric layer 502 may be deposited or grown prior to the formation of the semiconductor on insulator layer 503. In yet another embodiment, the semiconductor on insulator substrate 500 may be formed using wafer-bonding techniques, where a bonded wafer pair is formed utilizing glue, adhesive polymer, or direct bonding.

Figure 9:
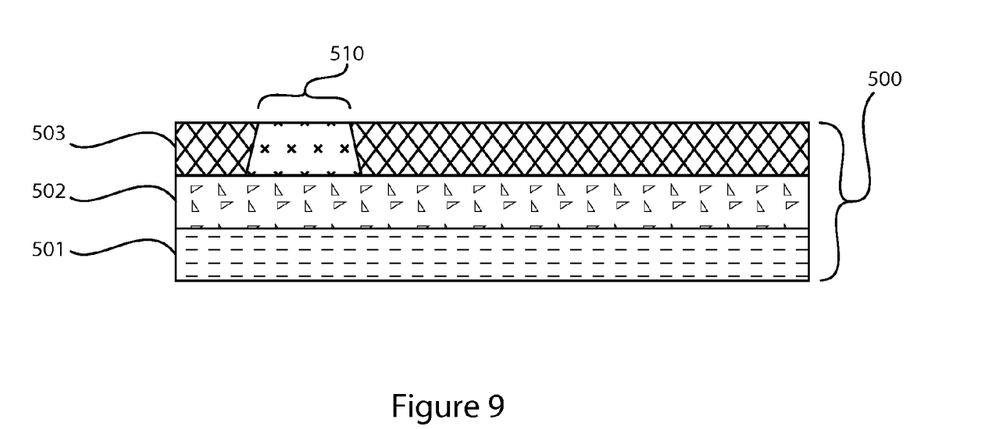
FIG. 9 is a side cross-sectional view depicting patterning the SOI layer of the SOI substrate depicted in FIG. 8 to provide an active region of a type IV semiconductor device, and forming an isolation region adjacent to the active region, in accordance with one embodiment of the present disclosure.

FIG. 9 depicts patterning the SOI layer 503 of the SOI substrate 500 depicted in FIG. 8 to provide an active region of a type IV semiconductor device 200, and forming an isolation region 504 adjacent to the active region. The isolation region 504 may be composed of any dielectric, such as an oxide, nitride or oxynitride material. For example, the isolation region 504 when composed of an oxide may be silicon oxide ($SiO_2$), and the isolation region 504 when composed of a nitride may be silicon nitride ($Si_3N_4$). In some embodiments, the isolation regions 504 may be formed using photolithography, etch and deposition processes. For example, an etch mask may be formed protecting the portion of the SOI layer 503 that provides the active region for the type IV semiconductor device 200, and expose the portion of the SOI layer 503 that is removed to provide a trench for forming the isolation region 504. The exposed portion of the SOI layer 503 may be removed by an etch process, which may be selective to the etch mask and the dielectric layer 502 of the SOI substrate 500. Following formation of the trenches, the etch mask may be removed and the trenches may be filled to provide the dielectric material of the isolation regions 504. The dielectric material may be deposited using chemical vapor deposition (CVD) or other deposition methods. The material suitable for the material of the isolation regions 504 may be the list of materials described above for the dielectric layer 10 that is described above with reference to FIG. 1. Following deposition, the dielectric material within the isolation regions 504 may be planarized so that an upper surface of the dielectric material is coplanar with an upper surface of the SOI layer 503 of the SOI substrate 500.

Figure 10:
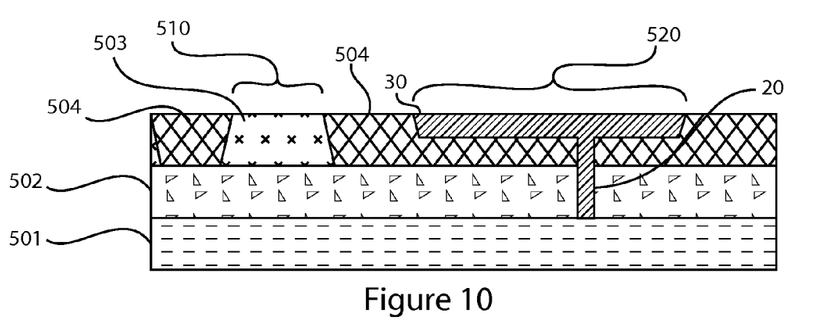
FIG. 10 is a side cross-sectional view depicting forming a III-V semiconductor material within a trench that is positioned in the isolation region depicted in FIG. 9, in accordance with one embodiment of the present disclosure.

FIG. 10 depicts one embodiment of forming a III-V semiconductor material 30 within a trench 15 that is positioned in the isolation region 504 depicted in FIG. 9. The III-V semiconductor material 30 that is depicted in FIG. 10 is similar to the III-V semiconductor material 30 that is described above with reference to FIG. 3. For example, in the embodiment that is depicted in FIG. 10, after forming the trench 15, a via 20 is formed in a portion of the trench 15 through the entire depth of the isolation region 504 to expose an upper surface of the base semiconductor layer 501. Similar to the semiconductor including substrate 5 depicted in FIGS. 1-7b, the exposed portion of the base semiconductor layer 50 depicted in FIG. 10 provides a seed surface for the growth of the III-V semiconductor material 30. Therefore, the description of the III-V semiconductor material 30 that is depicted in FIG. 3 is suitable for the III-V semiconductor material 30 that is depicted in FIG. 10.

Although not depicted in FIG. 10, in some embodiments, the portion of the III-V semiconductor material 30 that is present in the via 20 extending to the base semiconductor layer 501 is removed, and the via formed by removing the portion of the III-V semiconductor material 30 is filled with a dielectric similar to the methods and structures described above with reference to FIGS. 5-7B.

Figure 11:
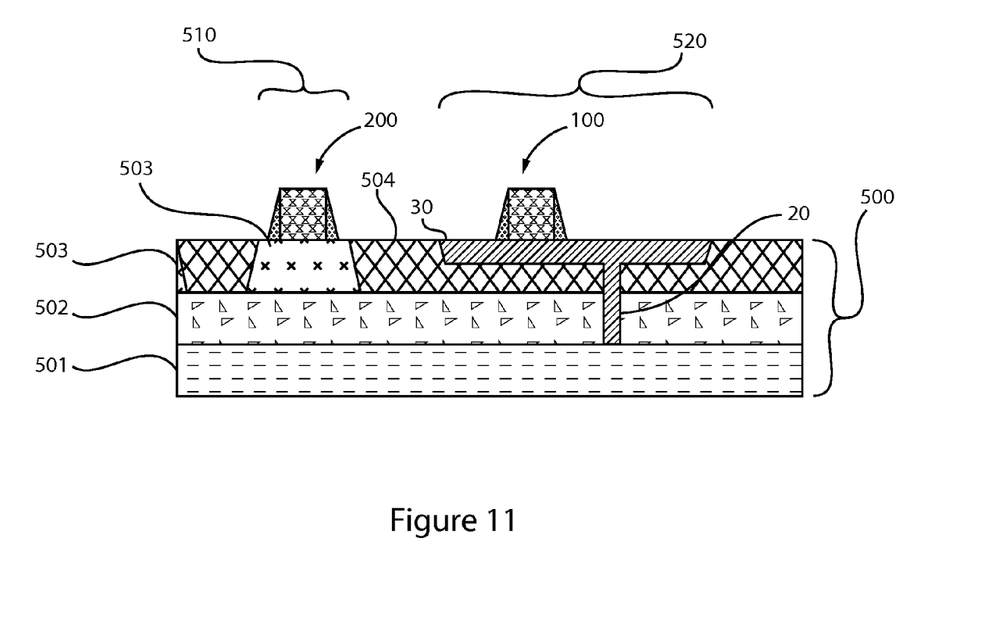
FIG. 11 is a side cross-sectional view depicting forming a first semiconductor device in the active region of the type IV semiconductor and forming a second semiconductor device on the III-V semiconductor material, in accordance with one embodiment of the present disclosure.

FIG. 11 depicts one embodiment of forming a first semiconductor device 200 in the active region 510 of the type IV semiconductor and forming a second semiconductor device 100' on the III-V semiconductor material 30. The active region 510 and the type III-V semiconductor material 30 may be selectively processed to provide the first and second semiconductor devices 200, 100' using block masks.

The second semiconductor device 100' that is depicted in FIG. 11 is similar to the semiconductor device 100 that is depicted in FIG. 4. Therefore, the description of the second semiconductor device 100 depicted in FIG. 4 including the gate structure 35, the gate sidewall spacer 38, the source region 39, the drain region 40 and the metal semiconductor alloy contact 45 is suitable for the description of the second semiconductor device 100, that is depicted in FIG. 10.

In some embodiments, the first semiconductor device 200 that is present in the active region 510 of the type IV semiconductor may include a gate structure, source region and drain region. The gate structure of the first semiconductor device 200 depicted in FIG. 10 may be similar to the gate structure 35 of the semiconductor device 100 that is depicted in FIG. 4. Therefore, the description of the gate structure 35 depicted in FIG. 4 is suitable for the gate structure of the first semiconductor device 200 depicted in FIG. 10. The source and drain regions of the first semiconductor device 200 that is depicted in FIG. 10 are doped to an n-type or p-type conductivity. For semiconductor devices formed using type IV semiconductors, i.e., formed on the active region 510 of the type IV semiconductor, n-type dopants for forming the source and drain regions may include, but are not limited to, antimony, arsenic and phosphorous. For semiconductor device formed using type IV semiconductors, i.e., formed on the active region 510 of the type IV semiconductor, p-type dopants for forming the source and drain regions may include, but are not limited to, boron, aluminum, gallium and indium.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
    forming a trench in a dielectric layer, the dielectric layer being present on a semiconductor including substrate;
    forming a via at a perimeter of the trench, wherein the via extending from a base of the trench present at a depth within the dielectric layer to an exposed upper surface of the semiconductor including substrate;
    epitaxially forming a III-V semiconductor material extending from the exposed upper surface of the semiconductor including substrate filling at least a portion of the trench, the III-V semiconductor material filling the via;
    forming the semiconductor device on the III-V semiconductor material that is present in the trench, wherein an active region of the semiconductor device that is formed in the III-V semiconductor material is separated from the perimeter of the trench;
    removing the III-V semiconductor material from the via; and
    filling the via with a dielectric material.

2. The method of claim 1, wherein the dielectric layer is comprised of an oxide, nitride or oxynitride material.

3. The method of claim 1, wherein the semiconductor including substrate is comprised of a silicon including material.

4. The method of claim 1, wherein the III-V semiconductor material is selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

5. The method of claim 1, wherein the trench has a width that is greater than a width of the via.

6. The method of claim 1, wherein the epitaxially forming of the III-V semiconductor material comprises at least one of a solid epitaxial growth sources including In, Ga, N, P elements and combinations thereof, and a gas precursor selected from the group consisting of trimethylgallium (TMG), trimethylindium (TMI), tertiary-butylphosphine (TBP), phosphine ($PH_3$), ammonia ($NH_3$), and combinations thereof.

7. The method of claim 1, wherein the forming of the semiconductor device on the III-V semiconductor material that is present in the trench comprises:
    forming a gate structure on a channel region portion of the III-V semiconductor material; and
    forming a source region and a drain region on opposing sides of the channel region portion.

8. The method of claim 1 further comprising removing etching the via and the III-V semiconductor material within the via to form an opening, and filling the opening with a dielectric material.

9. The method of claim 1, wherein the III-V semiconductor material is in direct contact with the base of the trench provided by the dielectric layer.

10. A method of forming a semiconductor substrate comprising:
    forming a trench in a dielectric layer, the dielectric layer being present on a semiconductor including substrate;
    forming a via within the trench, wherein the via extending from a base of the trench present at a depth within the dielectric layer to an exposed upper surface of the semiconductor including substrate;
    epitaxially forming a III-V semiconductor material extending from the exposed upper surface of the semiconductor including substrate filling the via and at least a portion of the trench;
    removing the III-V semiconductor material from the via; and
    filling the via with a dielectric material.

11. The method of claim 10, wherein the dielectric layer is comprised of an oxide, nitride or oxynitride material.

12. The method of claim 10, wherein the semiconductor including substrate is comprised of a silicon including material.

13. The method of claim 10, wherein the III-V semiconductor material is selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

14. The method of claim 10, wherein the trench has a width that is greater than a width of the via.

15. The method of claim 10, wherein the epitaxially forming of the III-V semiconductor material comprises at least one of a solid epitaxial growth sources including In, Ga, N, P elements and combinations thereof, and a gas precursor selected from the group consisting of trimethylgallium (TMG), trimethylindium (TMI), tertiary-butylphosphine (TBP), phosphine ($PH_3$), ammonia ($NH_3$), and combinations thereof.

16. An electrical device comprising:
a base semiconductor layer of a silicon including material;
a dielectric layer present on the base semiconductor layer;
a III-V semiconductor material present in a trench in the dielectric layer, wherein the III-V semiconductor material is in direct contact with at least the dielectric layer at a base of the trench;
a semiconductor device present on the III-V semiconductor material; and
a via filled with a dielectric extending from the trench to the base semiconductor layer, the via being present at a perimeter of the trench that is separated from the active portion of the III-V semiconductor material of the semiconductor device.

17. The electrical device of claim 16, wherein the III-V semiconductor material present in the trench has a defect density ranging of $1\times10^6$ defects/$cm^2$ or less.

18. The electrical device of claim 16, wherein the III-V semiconductor material present in the via at an interface with the base semiconductor layer has a defect density of $1\times10^9$ defects/$cm^2$ or greater.

19. The electrical device of claim 16, wherein the III-V semiconductor material is selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

20. The electrical device of claim 16, wherein the dielectric layer comprises a oxide, nitride, oxynitride or a combination thereof.

* * * * *